(12) United States Patent
Platt et al.

(10) Patent No.: US 7,132,721 B2
(45) Date of Patent: Nov. 7, 2006

(54) BONDING FOR A MICRO-ELECTRO-MECHANICAL SYSTEM (MEMS) AND MEMS BASED DEVICES

(75) Inventors: William P. Platt, Columbia Heights, MN (US); Carol M. Ford, Columbia Heights, MN (US)

(73) Assignee: Honeywell International, Inc., Morristown, NJ (US)

( * ) Notice: Subject to any disclaimer, the term of this patent is extended or adjusted under 35 U.S.C. 154(b) by 78 days.

(21) Appl. No.: 10/899,474

(22) Filed: Jul. 26, 2004

(65) Prior Publication Data

US 2004/0266048 A1    Dec. 30, 2004

Related U.S. Application Data

(62) Division of application No. 10/083,978, filed on Feb. 27, 2002, now Pat. No. 6,793,829.

(51) Int. Cl.
*H01L 27/14* (2006.01)
(52) U.S. Cl. .................................................. 257/414
(58) Field of Classification Search ................ 257/414; 438/51
See application file for complete search history.

(56) References Cited

U.S. PATENT DOCUMENTS

| | | | | |
|---|---|---|---|---|
| 3,599,123 A | 8/1971 | Krause | ......................... | 333/30 |
| 4,895,291 A | 1/1990 | Ozimek et al. | ............. | 228/121 |
| 4,930,001 A | 5/1990 | Williams | .................... | 257/737 |
| 5,106,009 A | 4/1992 | Humpston et al. | .......... | 228/195 |
| 5,118,026 A | 6/1992 | Stacher | ........................ | 228/157 |
| 5,668,033 A * | 9/1997 | Ohara et al. | ................ | 438/113 |
| 6,049,958 A | 4/2000 | Eberle et al. | ............... | 29/25.35 |
| 6,114,188 A | 9/2000 | Oliver et al. | ................ | 438/107 |
| 6,159,824 A | 12/2000 | Henley et al. | .............. | 438/455 |
| 6,232,150 B1 * | 5/2001 | Lin et al. | ..................... | 438/119 |
| 6,232,790 B1 * | 5/2001 | Bryan et al. | ................ | 324/754 |
| 6,234,378 B1 | 5/2001 | Ford et al. | .................. | 228/193 |
| 6,337,027 B1 * | 1/2002 | Humphrey | ..................... | 216/2 |
| 2001/0021570 A1 | 9/2001 | Lin et al. | ..................... | 438/455 |

FOREIGN PATENT DOCUMENTS

| | | |
|---|---|---|
| EP | 0 905 480 A2 | 3/1999 |
| EP | 0 981 159 A1 | 2/2000 |
| EP | 0981159 A1 | 2/2000 |
| WO | WO 96/19314 | 6/1996 |

OTHER PUBLICATIONS

International Search Report, Jan. 28, 2004.
U.S. Appl. No. 10/083,978, filed Feb. 27, 2002.

* cited by examiner

*Primary Examiner*—Lex H. Malsawma
(74) *Attorney, Agent, or Firm*—McDonnell Boehnen Hulbert & Berghoff LLP

(57) ABSTRACT

A method of bonding and packaging components of Micro-Electro-Mechanical Systems (MEMS) and MEMS based devices using a Solid-Liquid InterDiffusion (SLID) process is provided. A micro-machine is bonded to a micro-machine chip using bonding materials. A layer of chromium is first deposited onto surfaces of the micro-machine and the micro-machine chip followed by a layer of gold. Subsequently, a layer of indium is deposited between the layers of gold, and the surface of the micro-machine is pressed against the surface of the micro-machine chip forming a gold-indium alloy to serve as a bond between the micro-machine and the micro-machine chip. In addition, a cover is bonded to the micro-machine chip in the same manner providing a hermetic seal for the MEMS based device.

19 Claims, 8 Drawing Sheets

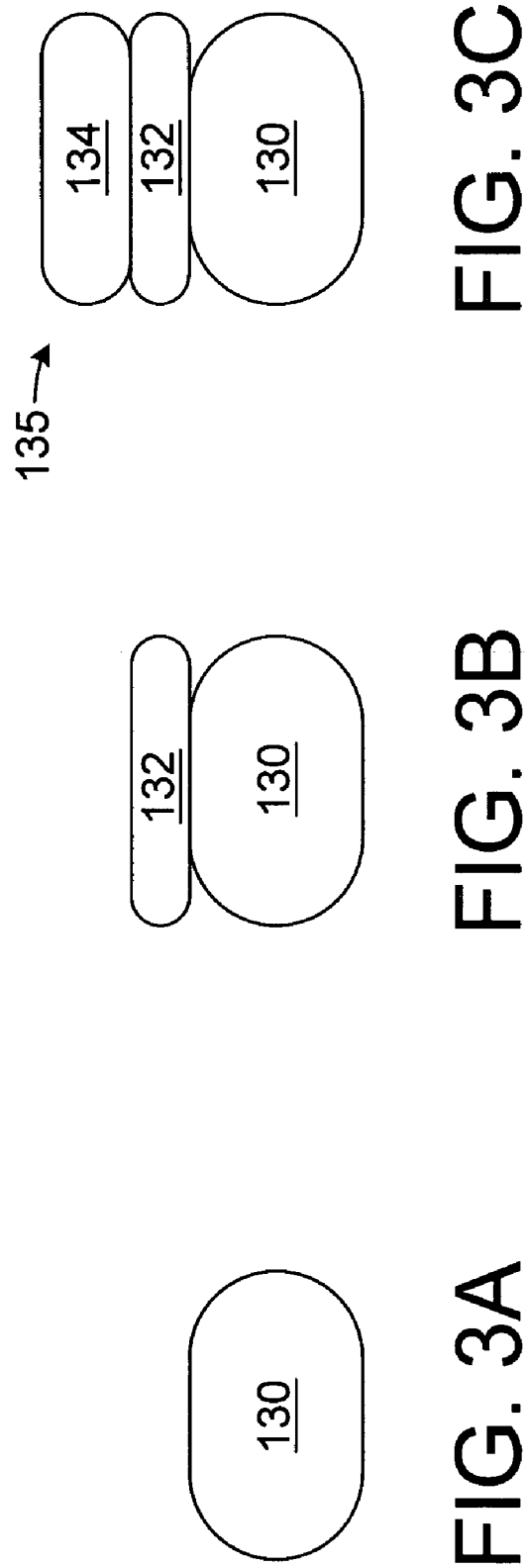

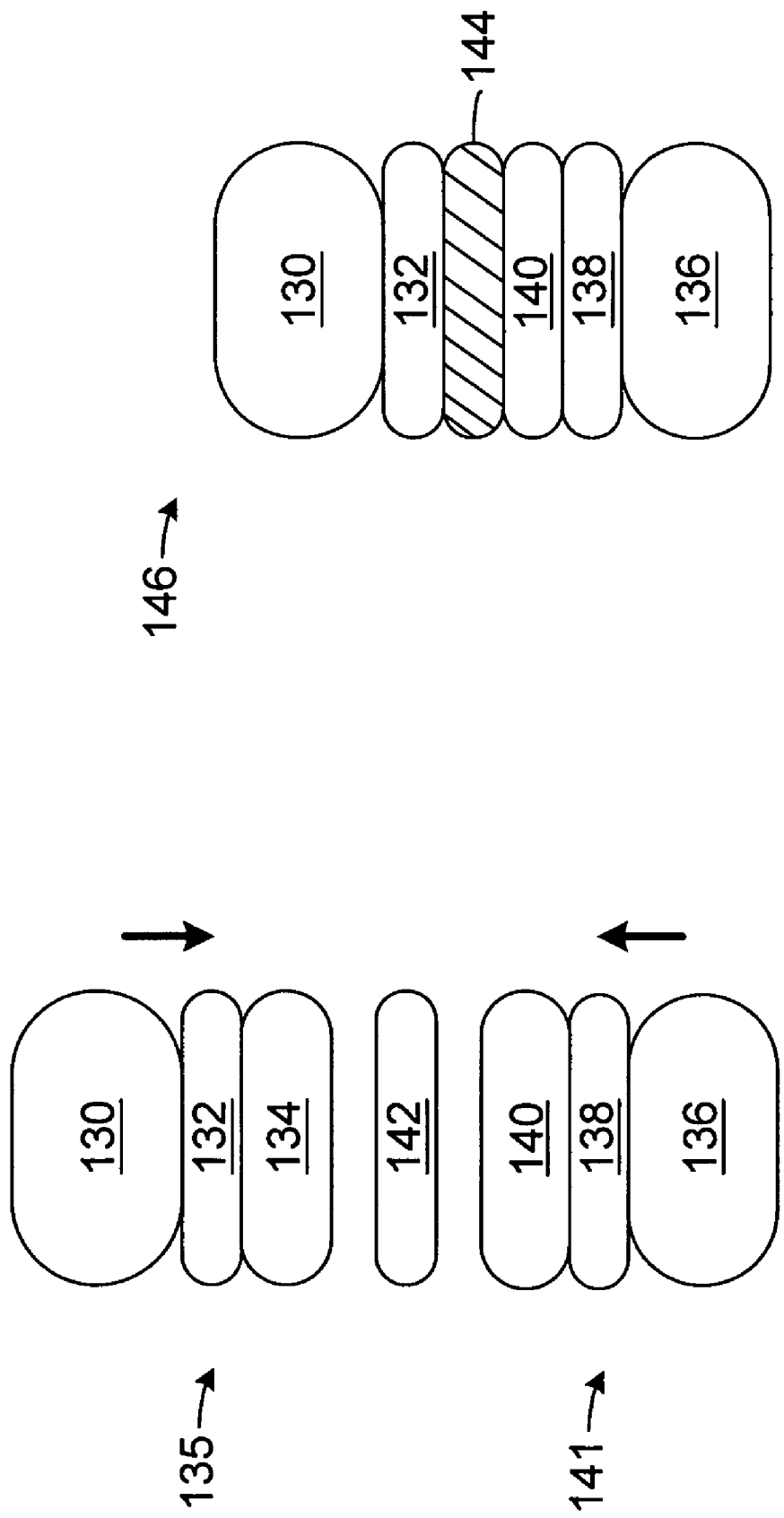

BONDING FOR A MICRO-ELECTRO-MECHANICAL SYSTEM (MEMS) AND MEMS BASED DEVICES

CROSS REFERENCE TO RELATED APPLICATION

The present patent application is a divisional application of U.S. patent application Ser. No. 10/083,978, filed on Feb. 27, 2002, now U.S. Pat. No. 6,793,829 which is entirely incorporated herein by reference, and to which the present patent application claims priority to under 35 U.S.C. § 120.

FIELD OF INVENTION

The present invention relates to manufacturing small electro-mechanical devices, and more particularly, to bonding and packaging of members of Micro-Electro-Mechanical Systems (MEMS) and MEMS based products using a Solid-Liquid InterDiffusion (SLID) bonding process.

BACKGROUND OF INVENTION

Micromechanics, micro-machines, or more commonly, Micro-Electro-Mechanical Systems (MEMS) are an integration of mechanical elements, such as sensors and actuators, and/or electronics on a common substrate through the utilization of micro-fabrication technology. MEMS range in size from a few microns to a few millimeters. While the electronics are fabricated using Integrated Circuit (IC) process sequences (e.g., CMOS, Bipolar, or BICMOS processes), micro-mechanical components are fabricated using compatible "micro-machining" processes that selectively etch away parts of a silicon wafer or add new structural layers to form mechanical and electromechanical devices.

MEMS bring together silicon-based microelectronics with micro-machining technology, thereby making possible the realization of a complete system-on-a-chip. MEMS augment the computational ability of microelectronics with the perception and control capabilities of microsensors and/or microactuators. Examples of such electrical and mechanical combinations are gyroscopes, accelerometers, micromotors, and sensors of micrometric size, all of which may need to be left free to move after encapsulation and packaging. MEMS may be used within digital to analog converters, air bag sensors, logic, memory, microcontrollers, and video controllers. Example applications of MEMS are military electronics, commercial electronics, automotive electronics, and telecommunications.

In the fabrication of MEMS and other microstructures, two substrates or components may be structurally integrated together, such as by structural bonding. The structural bonds can be provided by any of several bonding techniques known in the art. For example, a direct bond may be formed by joining two clean, polished surfaces together under compressive force. Alternatively, two adjacent solder structures may be integrated and bonded together by reflowing the solder at an elevated temperature. In addition, an anodic bond may be formed between an insulating substrate and a conducting or semi-conducting substrate by the application of a high voltage, such as 1,000 volts, across a junction at an elevated temperature. Structural bonds, such as the aforementioned, are well developed for providing mechanical integration of two or more microstructures. However, a structural bond's strength may not be effective under harsh conditions. Additionally, these structural bonding methods are each application specific bonding methods and they also may not be viable methods for bonding within a fragile device such as a MEMS.

In some microstructure and MEMS applications, a pressure seal may be desired, such as to isolate a cavity internal to a MEMS or other microstructure from the surrounding environment. Pressure seals may be required, for instance, when a high-pressure gas atmosphere is desired inside a cavity, such as for example, to increase a breakdown voltage threshold used within an electrical component of a MEMS. In other applications, an evacuated cavity may be required, such as for example, for improving a thermal isolation of suspended radiation detectors in a microbolometer. Unfortunately, common structural bonding techniques are generally inadequate to provide pressure sealing because of surface variations and imperfections that preclude the formation of a tight seal across the full extent of a structural bond.

In the packaging of MEMS devices, protection is an important element because corrosion, moisture and debris can prevent the devices from working. Each device should be hermetically sealed, allowing only a negligible amount of gas to be exchanged between the passages in the MEMS body and the atmosphere during the life of the MEMS, in order to prevent the device from becoming contaminated. Existing packaging of MEMS devices typically involve selecting an appropriate arrangement of the MEMS device within a system, selecting an appropriate material for use in bonding the MEMS device in the system, and selecting an appropriate process for applying the material to create a bond. These packaging solutions often involve redesigning a MEMS layout due to materials and processes used, and therefore, are burdensome to accomplish. For example, in a Leadless Ceramic Chip Carrier (LCCC) package, a lid may be soldered to seal the package. However, outgassing may occur when soldering which requires the use of getters to alleviate the outgassing. This results in additional materials, processes, time, and costs.

MEMS packaging presents challenges compared to IC packaging due to the diversity of MEMS devices and the requirement that many of these devices are in continuous and intimate contact with their environment. Presently, nearly all MEMS development efforts must develop a new and specialized package each time a new device is designed. Application specific packaging is not an efficient method of sealing MEMS based products. Consequently, most manufacturers find that packaging is the single most expensive and time-consuming task in a MEMS product development program. Such packaging as wafer level protected MEMS, capped MEMS, and several other types of molded packages have been used by manufacturers. All of these options can be realized in System in Package (SiP) solutions that combine multiple chips and passive devices into one device. These SiP solutions are aimed at reducing the cost of MEMS packaging and providing standardization solutions, however these packaging options may increase the costs of MEMS due to additional design efforts, and since each device requires a specific package, it is believed that the standardization of MEMS packaging can not be realized using known techniques.

One of skill in the art would appreciate a bonding and packaging process that is capable of handling a mass production of MEMS. It would also be desirable to provide a simple process for bonding and packaging MEMS devices to enable design and manufacturing to be completed in a timely fashion and at a low cost.

It would also be desirable to provide a low temperature process for the bonding and packaging of MEMS devices that yields a high temperature and high strength bond. In addition, a selective temperature process for bonding may be desired using materials having different properties such as compositions and melting temperatures.

It would also be desirable to provide a single bonding process for bonding components to MEMS devices and for packaging the MEMS devices in order to simplify the manufacturing process of MEMS devices. For example, a uniform bonding and packaging method is desired for use in approximately all bonds present in a MEMS device.

SUMMARY OF THE INVENTION

In view of the above, a method of forming a bond between mating surfaces of members of a Micro-Electro-Mechanical System (MEMS) is provided. The method comprises depositing a first layer of material on a first mating surface. The first layer of material is selected from the group consisting of gold and tin. For example, a material selected from Groups 11 or 14 of the periodic table of elements may be a suitable material with desired properties for bonding. A second layer of material is deposited on a second mating surface. The second layer of material is selected from the group consisting of indium and lead. The first mating surface is pressed against the second mating surface, thereby pressing the first layer of material to the second layer of material. An alloy is formed between the mating surfaces serving as the bond between the first mating surface and the second mating surface of the members of the MEMS.

In another embodiment, a Micro-Electro-Mechanical System (MEMS) is provided including a substrate, a micro-machine coupled to the substrate and a cover coupled to the substrate. The cover and the micro-machine are coupled to the substrate by forming at least one bond between mating surfaces of the cover and the substrate and between mating surfaces of the micro-machine and the substrate. The at least one bond is formed by depositing a first layer of material on a first mating surface. The first layer of material is selected from the group consisting of gold and tin. A second layer of material is deposited on a second mating surface. The second layer of material is selected from the group consisting of indium and lead. The first layer of material is pressed against the second layer of material, thereby forming an alloy to serve as the bond between the first mating surface and the second mating surface of the cover and the substrate and between the first mating surface and the second mating surface of the micro-machine and the substrate.

These as well as other features and advantages of the present invention will become apparent to those of ordinary skill in the art by reading the following detailed description, with appropriate reference to the accompanying drawings.

BRIEF DESCRIPTION OF FIGURES

Presently preferred embodiments of the invention are described below in conjunction with the appended drawing figures, wherein like reference numerals refer to like elements in the various figures, and wherein:

FIGS. 3A–3C are conceptual process diagrams showing various stages of a method of processing a surface according to one embodiment of the present invention;

FIG. 5A illustrates a conceptual processing step employed in one embodiment of the present invention;

FIG. 5B illustrates a conceptual final bond created in accordance with one embodiment of the present invention;

DETAILED DESCRIPTION OF EXEMPLARY EMBODIMENTS

A. Overview

In accordance with exemplary embodiments of the present invention, a method is provided for bonding and packaging components and members of Micro-Electro-Mechanical Systems (MEMS) and MEMS based products using a Solid-Liquid InterDiffusion (SLID) bonding process, a process not believed to have been previously contemplated in the MEMS and MEMS based technology field. For example, a MEMS product such as a ring-laser gyroscope, may be manufactured using a bonding and packaging process according to embodiments of the present invention. Additionally, devices such as micro-machines as well as devices fabricated using nano-technology or other electronic and mechanical processing methods, may be bonded and packaged in accordance with embodiments of the present invention. Furthermore, a description of a MEMS device fabricated in accordance with one embodiment of the present invention is provided.

B. A Microchip Package for MEMS Based Products

Figure 1A:
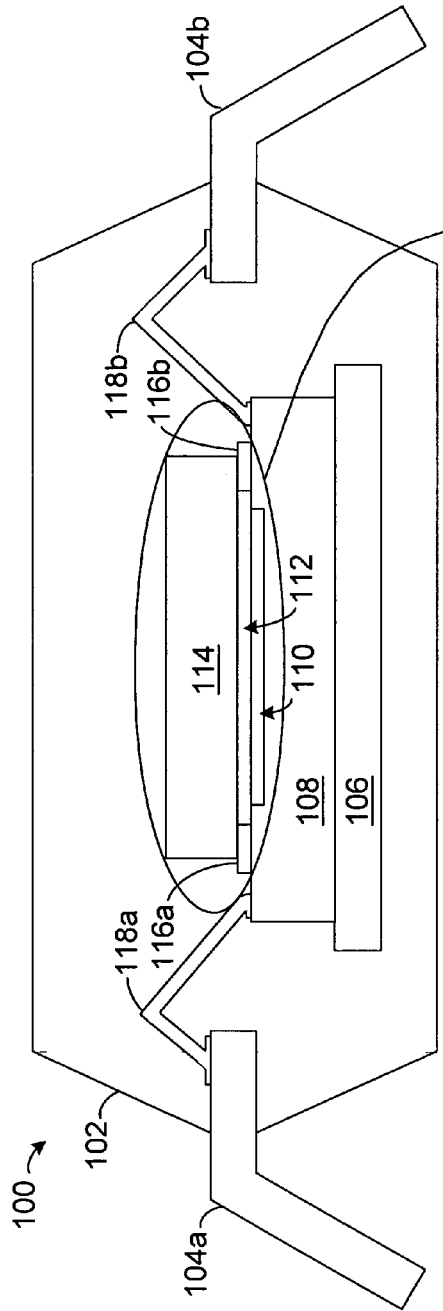
FIG. 1A is a side view of an illustration of packaging employed in accordance with one embodiment of the present invention.

FIG. 1A is a side view of an illustration of packaging employed in accordance with one embodiment of the present invention. A chip 100 is provided as a housing for a micro-machine 110. The chip 100 includes a molded plastic package 102 comprising multiple pins 104a–b. A substrate 106 is present at the base of the chip 100 within the plastic package 102. A micro-machine chip 108 is coupled to the substrate 106 and to the micro-machine 110. A cover 114 is coupled to the micro-machine chip 108 using multiple bonds 116a–b. The cover 114 is coupled to the micro-machine chip 108 in a manner such that open space 112 remains between the cover 114 and the micro-machine 110. Leads 118a–b are present to electrically couple the micro-machine chip 108 to the pins 104a–b.

The chip 100 illustrated in FIG. 1A may comprise more or fewer members than described. For instance, two pins 104a–b have been illustrated, although those skilled in the art will recognize that a chip may comprise no extruding pins or hundreds of pins. Additionally, more or fewer members may be present in the chip 100 other than the substrate 106, the micro-machine chip 108, the micro-machine 110 and the cover 114. In one embodiment, the chip 100 comprises a MEMS with the micro-machine 110 illustrated in FIG. 1A operable to perform electrical and mechanical operations. The cover 114 is preferably comprised of a material such as silicon, glass or a ceramic material. The cover 114 includes a cavity which allows open space 112 between the cover 114 and the micro-machine 110 providing components of the micro-machine 110 the ability to move freely. For example, a miniaturized valve may be movably coupled to the micro-machine 110 and the valve may open and close within the open space 112 provided. The micro-machine 110 may be any such electromechanical machine used in accordance with MEMS and MEMS based devices and may be comprised of a silicon substrate. For instance, the micro-machine 110 may be a sensor for use in an air-bag system in an automobile.

Figure 1B:
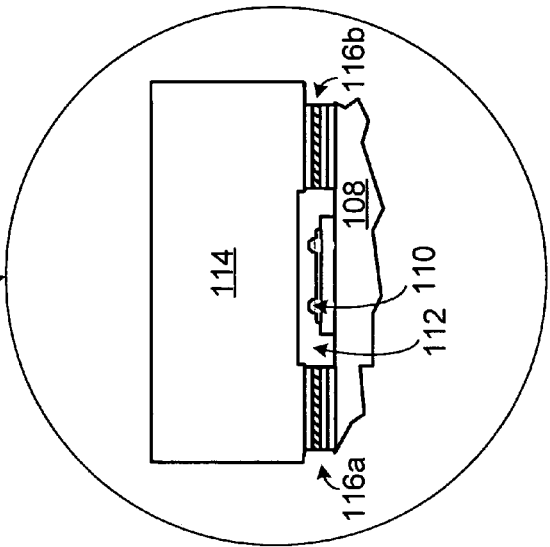
FIG. 1B is an expanded view of FIG. 1A illustrating bonds arranged in accordance with one embodiment of the present invention.

FIG. 1B is an expanded view of a portion of FIG. 1A illustrating the bonds 116a–b between the cover 114 and the micro-machine chip 108 arranged in accordance with one embodiment of the present invention. Multiple layers of material are illustrated composing the bonds 116a–b. More or fewer layers of material may be used in accordance with various embodiments of the present invention. In one embodiment, the cover 114, as illustrated in FIG. 1A, is bonded to the micro-machine chip 108. In another embodiment, the cover 114 may be bonded directly to the substrate 106. In this second embodiment, the leads 118a–b pass through the cover 114 to electrically couple the micro-machine chip 108 to the pins 104a–b. The cover 114 preferably fully covers the micro-machine 110.

Figures 2A, 2B:
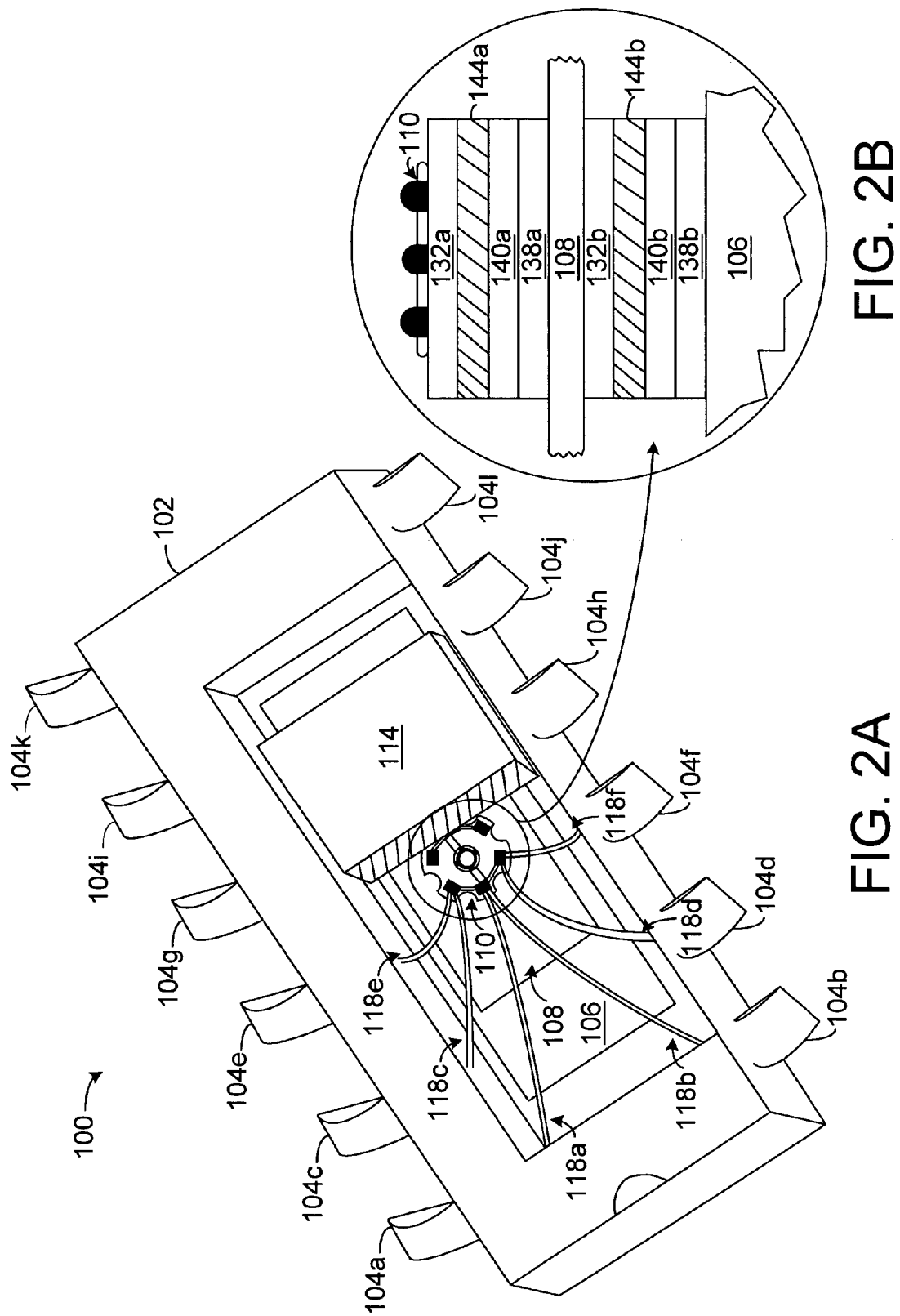
FIG. 2A is a cut open top view of FIG. 1A.
FIG. 2B is an expanded view of FIG. 2A illustrating bonds arranged in accordance with one embodiment of the present invention.

FIG. 2A is a cut open top view of the chip 100. The substrate 106 is shown mounted within a base of the chip 100 with the micro-machine chip 108 mounted upon the substrate 106. The micro-machine 110 is shown mounted upon the micro-machine chip 108. A portion of the cover 114 is illustrated as well. As illustrated in FIG. 2A, the cover 114 fully covers the micro-machine 110 and the micro-machine chip 108. The cover 114 may only need to fully cover the micro-machine 110 to provide a hermetic seal for protection of the micro-machine 110. The chip 100 is illustrated with twelve pins 104a–l. Each pin 114a–l has a corresponding lead electrically coupling the pins 104a–l to the micro-machine chip 108. As shown in FIG. 2A, pins 104a–f are illustrated with corresponding leads 118a–f. A chip may contain more or fewer pins than are illustrated within FIG. 2A. Moreover, the cover 114 need not entirely cover the micro-machine 110 in some applications, such as gas-sensing applications.

FIG. 2B is an expanded view of a portion of FIG. 2A illustrating a bond between the micro-machine chip 108 and the substrate 106, and a bond between the micro-machine 110 and the micro-machine chip 108 arranged in accordance with one embodiment of the present invention. The bonds comprise multiple layers of materials shown as 132a, 144a, 140a and 138a, and 132b, 144b, 140b and 138b. More or fewer layers of materials may be used in the bonds than are illustrated. The bonds couple the micro-machine chip 108 to the substrate 106 and the micro-machine 110 to the micro-machine chip 108.

It will be understood, however, that the packaging employed in FIGS. 1A, 1B, 2A, and 2B are examples only, and embodiments of the present invention are not limited to such plastic packaging options or to bonds comprising multiple layers. For example, in another embodiment, a Leadless Ceramic Chip Carrier (LCCC) package may be used as a housing for the micro-machine 110. In an exemplary embodiment, a ring-laser gyroscope MEM is manufactured using the bonds 116a–b shown in FIG. 1B and an LCCC package (not illustrated). The LCCC package may be provided without external metallic pins, such as pins 104a–b illustrated in FIG. 1A, but rather with a metallized castellation exposed on the underside of the LCCC package for electrical connections. The LCCC package may also use the bonds 116a–b illustrated in FIG. 1B to seal the package around the ring laser gyroscope.

C. Preparation of Surfaces for Bonding Members to MEMS Based Products

FIGS. 3A–3C are conceptual process diagrams showing stages of processing an upper mating surface 130 in accordance with one embodiment of the present invention. The processes illustrated in FIGS. 3A–3C illustrate a method of preparing the upper mating surface 130 in order to bond the upper mating surface 130 to another mating surface. FIG. 3A illustrates the upper mating surface 130. The upper mating surface 130 may be a surface of the micro-machine 110, or a surface of the cover 114. A layer of an upper bonding material 132 is deposited on the upper mating surface 130. In a preferred embodiment, the upper bonding material 132 is a layer of chromium (Cr) having a thickness of about 20 Angstroms. The upper bonding material 132 may comprise a layer of chromium having a thickness between about 5 Angstroms to approximately 100 Angstroms. The upper bonding material 132 may also be a material having properties similar to those of chromium such as Group 6 elements.

In another embodiment, the upper bonding material 132 may be omitted. For instance, if the upper mating surface 130 comprises a metal or a ceramic mating surface, then the layer of chromium may provide little or no benefit. The upper bonding material 132 is chosen to have preferred adhering properties to the upper mating surface 130 to allow a second bonding material to be deposited onto the upper bonding material 132, thereby allowing the second bonding material to be deposited onto the upper mating surface 130. The upper bonding material 132 more suitably bonds with selected mating surfaces than the resulting bond formed. FIG. 3B illustrates the upper bonding material 132 deposited onto the upper mating surface 130.

A layer of an upper diffusion material 134 is then deposited onto the upper bonding material 132. In one embodiment, the upper diffusion material 134 is a layer of gold (Au) with a thickness of about 1 micron. In another embodiment, the upper diffusion material 134 is a layer of tin (Sn) with a thickness of about 1 micron. The upper diffusion material 134 may be as thin as about 100 Angstroms or as thick as about 63,500,000 Angstroms (i.e., 0.25 inches), according to embodiments of the present invention. Alternate materials that may be used for the upper diffusion material 134 are materials with similar properties to those of gold such as noble metals, inert metals, or elements selected from Groups 1B, 2B, and 3B of the periodic table of elements. FIG. 3C illustrates the upper mating surface 130 with the upper diffusion material 134 deposited upon the upper bonding material 132. An upper mating layer 135 comprises the upper mating surface 130, the upper bonding material 132 and the upper diffusion material 134. In an alternative embodiment, the upper mating layer 135 comprises only the upper mating surface 130 and the upper diffusion material 134.

Figure 4C:
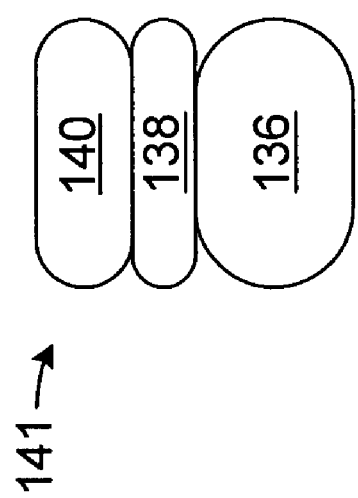
FIGS. 4A–4C are conceptual process diagrams showing various stages of a method of processing another surface according to one embodiment of the present invention.
Figure 4B:
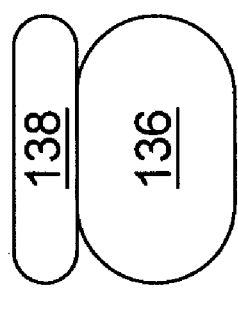
Figure 4A:
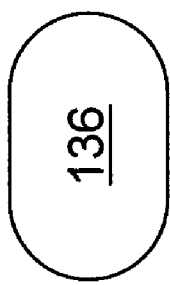

FIGS. 4A–4C are conceptual process diagrams showing stages of one method of processing a lower mating surface 136 according to one embodiment of the present invention.

FIGS. 4A–4C illustrate a process of preparing the lower mating surface 136 for bonding to another surface. FIG. 4A illustrates the lower mating surface 136. The lower mating surface 136 may be a surface of the substrate 106, or a surface of the micro-machine chip 108. A layer of a lower bonding material 138 is deposited on the lower mating surface 136. In a preferred embodiment, the lower bonding material 138 is a layer of chromium (Cr) having a thickness of about 20 Angstroms. The lower bonding material 138 may comprise a layer of chromium having a thickness between about 5 Angstroms to approximately 100 Angstroms. Alternate materials that may be used for the lower bonding material 138 are materials having properties similar to those of chromium, such as elements of Group 6 of the periodic table of elements. In another embodiment, the lower bonding material 138 is omitted. For instance, if the lower mating surface 136 is a metal or a ceramic surface, then the layer of chromium can be omitted. FIG. 4B illustrates the lower bonding material 138 deposited on the lower mating surface 136.

A layer of a lower diffusion material 140 is then deposited onto the lower bonding material 138. In one embodiment, the lower diffusion material 140 is a layer of gold (Au) having a thickness of about 1 micron. In another embodiment, the lower diffusion material 140 is a layer of tin (Sn) having a thickness of about 1 micron. The lower diffusion material 140 may comprise a layer of thickness between about 100 Angstroms to about 0.25 inches. Alternate materials that may be used for the lower diffusion material 140 are materials with similar properties to those of gold such as noble metals, inert metals, or elements selected from Groups 1B, 2B, and 3B. FIG. 4C illustrates the lower diffusion material 140 deposited onto the lower bonding material 138. As illustrated in FIG. 4C, a lower mating layer 141 comprises the lower mating surface 136, the lower bonding material 138 and the lower diffusion material 140.

The upper mating surface 130 and the lower mating surface 136 are interchangeable. In a preferred embodiment, the upper mating surface 130 is either a surface of the micro-machine 110 or a surface of the cover 114, as mentioned. However, the upper mating surface may also be a surface of the substrate 106, a surface of the micro-machine chip 108 or other surfaces of members of the chip 100. Likewise, the lower mating surface may comprise a surface of the micro-machine 110, a surface of the cover 114 or other surfaces of members of the chip 100. For example, additional elements may be bonded to an upper surface of the micro-machine 110 or the cover 114.

The processing illustrated in FIGS. 3A–3C and FIGS. 4A–4C prepares the lower mating surface 136 and the upper mating surface 130 to be bonded together. The processing of the upper mating surface 130 as shown in FIGS. 3A–3C and the processing of the lower mating surface 136 as shown in FIGS. 4A–4C may occur simultaneously or sequentially. In addition, cleaning and preparation of these surfaces may be necessary prior to the deposition of bonding materials, and prior to bonding these surfaces together. For example, the upper mating surface 130 and the lower mating surface 136 should be sufficiently clear of impurities to allow for an effective bond without defects to form between the upper and lower mating surfaces 130, 136.

FIG. 5A illustrates a conceptual processing step employed in one embodiment of the present invention. FIG. 5A illustrates one step of the preparation of the upper mating surface 130 and the lower mating surface 136 to be bonded together. An interdiffusion material 142 is deposited between the upper diffusion material 134 and the lower diffusion material 140. The interdiffusion material 142 may be deposited onto the lower diffusion material 140 or onto the upper diffusion material 134. In one embodiment, the interdiffusion material 142 is indium (In) having a thickness between about 50 Angstroms to about 0.125 inches depending on the thickness of the lower and upper diffusion materials 140, 134. It may be desired to provide the lower and upper diffusion materials 140, 134 and the interdiffusion material 142 in a 2:1 ratio. In another embodiment, the interdiffusion material 142 is lead (Pb) having a thickness of about 50 Angstroms to about 0.125 inches. Additional interdiffusion materials may be used such as materials with similar properties to those of indium and lead.

FIG. 5B illustrates a conceptual alloy bond 146 created in accordance with one embodiment of the present invention. The upper mating layer 135 is pressed against the lower mating layer 141 with the interdiffusion material 142 deposited between the two layers to create an alloy to serve as a bond. The upper mating layer 135 and the lower mating layer 141 are heated while being pressed together. The pressure, heat, and time of each applied during the bonding process depends upon the elements used within the bond. A preferred embodiment of the present invention will now be discussed in relation to an example.

D. Example: Bonding a Metal Base to a Glass Component in a MEMS Device

In one instance, a glass upper mating surface 130 may be bonded to a metal dielectric lower mating surface 136. Approximately, a 100 Angstrom layer of chromium is deposited on the glass surface and on the metal surface. The chromium layers are the upper and lower bonding materials 132, 138 as illustrated in FIG. 5A. Approximately, a one micron layer of gold is then deposited onto each of the chromium layers. The gold layers are the upper and lower diffusion materials 134, 140 as illustrated in FIG. 5A. Approximately, a one micron indium layer is then deposited onto only one of the gold layers. The indium layer may be deposited onto either gold layer. The indium layer is the interdiffusion material 142 as illustrated in FIG. 5A. The indium layer 142 thickness is half the thickness of the combination of the gold layers 134, 140 in accordance with the desired 2:1 ratio of the lower and upper diffusion materials 140, 134 and the interdiffusion material 142.

The glass and metal surfaces 130, 136 are then coupled together by pressing the glass surface 130, with the chromium and gold layers 132, 134 deposited on its surface, against the metal surface 136, with the chromium and gold layers 138, 140 deposited on its surface, with the indium layer 142 deposited between the two surfaces 130, 136 at a pressure of 2 Pounds per Square Inch (PSI), and at a temperature of 100° Celsius (C) for approximately 6 hours. The layers of materials are heated to 100° C. in order to stimulate a thermal diffusion process between the elements to allow for the elements to diffuse into one another. Upon applying the pressure, an alloy material 144 is created comprising the gold and indium elements as illustrated in FIG. 5B. Using these specified amounts of pressure, heat, and time, theoretically a two or three time constant safety factor of the diffusion of the indium layer 142 into the gold layers 140, 134 will result. For instance, the diffusion of the indium layer 142 into the gold layers 140, 134 may be sufficiently complete after 1 hour using the specified temperatures and pressures, however after 6 hours, the diffusion can be assured to be complete. In this example, it may be necessary to have a two to one ratio of gold to indium in order to avoid a residual build-up of indium during the bonding process.

Within the example discussed above, a preferred pressure, temperature, and time of applying each are specified. However, alternate pressures, temperatures and times would also result in acceptable bonds and alloy materials 144. The time for applying the pressure and temperature is related to the rate of diffusion for the elements. For instance, increasing the temperature from about 100° C. to about 200° C. would lower the diffusion time to approximately a few minutes because the indium layer 142 would diffuse more rapidly into the gold layers 134, 140. The rate of diffusing the indium layer 142 into the gold layers 134, 140 approximately doubles for every 10° C. increase in temperature. Using higher temperatures relieves stress within the bonding process. As mentioned, it may be necessary to provide alloys comprised of two micron layers of gold or tin bonded with a one micron layer of indium or lead in accordance with a 2:1 ratio of gold and tin to indium and lead to provide a suitable bond.

The time-temperature-pressure relationship used in the example bonding process may be calculated using equation 1 (Eq. 1) provided below:

$$D=D_0 * \exp(-Q/(RT))  \quad (Eq. 1)$$

Where: D is the diffusion rate
$D_0$ is the diffusion constant in units of $cm^2/sec$
Q is the activation energy in units of cal/mole
T is temperature in units of Kelvin
R is the Gas Constant; i.e., 1.98 cal/mole K The diffusion constant ($D_0$) and activation energy (Q) are dependent upon the materials chosen for the bond. The diffusion constant and the activation energy of selected materials may be found in a reference book such as "Chemical Rubber Company (CRC) Handbook of Chemistry and Physics," under section heading "Radioactive Tracer Diffusion Date for Pure Metals," pages F-46–F-52, the full disclosure of which is herein incorporated by reference. The following is a table of diffusion constants and activation energies from the CRC Handbook of representative materials for use in embodiments of the present invention:

| Materials | Q (cal/mole) | $D_0$ ($cm^2/sec$) |
|---|---|---|
| In diffused into Au | 6700 | 0.009 |
| Sn into Au | 11000 | 0.0058 |
| Zinc into Silver | 27600 | 0.45 |
| Pb into Copper | 14440 | 0.046 |

Indium and gold may be preferred for use in the bonding process of embodiments of the present invention. The low activation energy and relatively high diffusion constant of indium diffusion into gold leads to a low temperature process that forms a high strength and high temperature bond.

The above equation (Eq. 1) may be used to calculate an effective temperature necessary to meet a desired diffusion rate that may be established due to manufacturing constraints and due to properties of selected materials. The pressure used in the bonding process may be primarily used to place the upper mating surface 130 and the lower mating surface 136 into intimate contact with each other. Consequently, an effective pressure is needed to press and hold the upper and lower mating surfaces 130, 136 in contact with each other. For example, a pressure as low as that necessary to place the upper and lower mating surfaces into contact with each other may be used. Alternatively, a high pressure, such as a few thousand PSI, may be used which may result in a stronger bond. The bonding process may be considered complete by using a one or two time constant safety factor. A bond strength may be tested by using a pull test. For instance, a pull test machine, such as an Instron® fatigue test machine, may be used to test the integrity of the bond.

The strength of the bond formed using the bonding process mentioned may be determined by the depth of diffusion of the indium layer 142 into the gold layers 134, 140. The depth of diffusion, x, can be estimated and calculated by using equation 2 (Eq. 2) provided below:

$$x=sq(D*t) \quad (Eq. 2)$$

Where: x is the distance where 50% of diffusion has occurred in units of cm
sq( ) is square root of ( )
D is the diffusion rate in units of $cm^2/sec$
T is time in units of seconds Within the example above, given a selected bonding temperature, such as about 20° C. or about 300 Kelvin, and thickness of materials, such as about 0.01 cm depth of diffusion, the effective time required to diffuse the indium layer 142 into the gold layers 134, 140 can be calculated as follows:
(i) Obtain Q and $D_0$ from CRC Handbook for In diffusion into Au: Q=6700 cal/mole
$D_0$=0.009 $cm^2/sec$
(ii) Calculate D from Eq 1: D=0.009 exp(−6700/(1.98*300))=1.136e−07 $cm^2/sec$
(iii) Calculate time to diffuse 50%: t=($x^2$/D)=(0.0001/1.136e−07)=880.28 seconds
(iv) After approximately 900 seconds (i.e., 15 minutes), 50% of diffusion will have occurred, then after 6 hours at least 99% of diffusion can be assumed to have occurred Increasing the temperature to about 130° C. (i.e., about 400 Kelvin), increases the diffusion rate to D=1.906e−06 $cm_2$/sec and lowers the time to diffuse to t=52.47 seconds for 50% diffusion. The time is related to the temperature used as shown in Eq. 2 above. An effective time for the bonding process to conclude may be estimated after calculating the time necessary for 50% diffusion. For instance, in the example above, after 15 minutes, 50% diffusion of the indium layer 142 into the gold layers 134, 140 will have occurred. It can then be estimated and assumed that after an effective time, such as 6 hours, approximately 99% diffusion will have occurred. An effective time such as 1 hour may be sufficient for a suitable bond strength in other applications.

In a preferred embodiment, the alloy material 144 is comprised of gold and indium. For example, the resulting alloy material 144 may be $AuIn_2$. Indium has a melting temperature of 156° C. and gold has a melting temperature of 1064° C. Therefore, when selecting gold and indium layer thickness, the gold layer should be of sufficient thickness to enable the indium layer to substantially diffuse into the gold layer. The temperature chosen at which to bond the upper mating layer 135 to the lower mating layer 141 should raise the temperature of the area of contact between the upper and lower diffusion materials 134, 140 and the interdiffusion material 142 above the melting temperature of the eutectic binary alloy of the materials used while pressing the upper mating layer 135 to the lower mating layer 141. For example, using gold for the upper and lower diffusion materials 134, 140 and using indium for the interdiffusion material 142, the melting temperature of an eutectic gold-indium alloy such as $AuIn_2$, is about 495° C.

The alloy material 144 results from the upper and lower diffusion materials 134, 140 and the interdiffusion material 142. As illustrated in FIG. 5B, part of the lower diffusion material 140 remains. Alternatively, a portion of the upper diffusion material 134 may remain. Likewise, portions of both the upper and lower diffusion materials 134, 140 may remain, or both of the upper and lower diffusion materials 134, 140 may be completely formed and consumed within the alloy material 144.

E. Bonding Members of MEMS Based Products

Figure 6B:
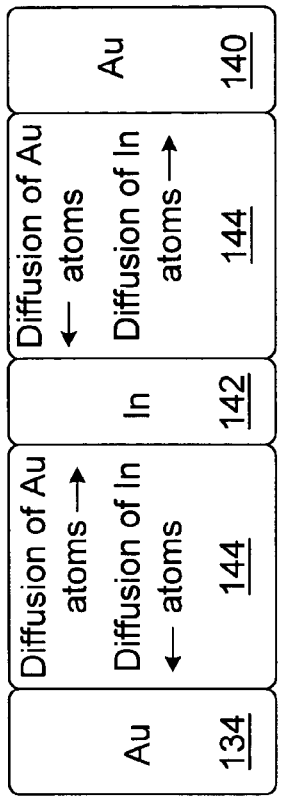
FIGS. 6A–6B conceptually illustrate the processing step of FIG. 5A.
Figure 6A:
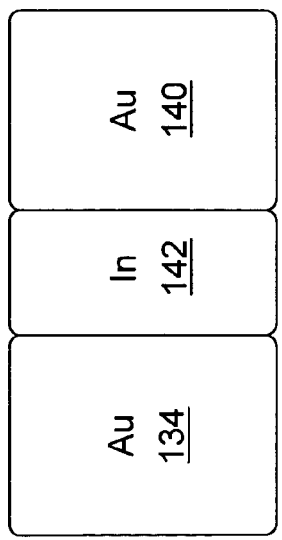

FIG. 6A illustrates a bonding process implemented in accordance with one embodiment of the present invention. FIG. 6A is an expanded detailed conceptual view of the alloy bond 146. Within FIG. 6A, and subsequently FIGS. 6B, 7A, 7B, 8A, and 8B, the upper and lower diffusion materials 132, 140 are illustrated as gold, and the interdiffusion material 142 is illustrated as indium. The upper and lower diffusion materials 134, 140 are placed adjacent one another with the interdiffusion material 142 placed in between as illustrated within FIG. 5A. In one embodiment, the amount of the gold layers 134, 140 is applied in excess of the amount of the indium layer 142. For example, the thickness of the gold layers 134, 140 may be approximately twice the thickness of the indium layer 142, as mentioned.

FIG. 6B conceptually illustrates a bonding process implemented in accordance with one embodiment of the present invention. The alloy material 144 forms between each gold layer 134, 140 and indium layer 142 upon pressing the gold layers 134, 140 and indium layer 142 against one another. Gold atoms diffuse into both sides of the indium layer 142 as shown by arrows in FIG. 6A. Likewise, indium atoms diffuse into each of the gold layers 134, 140 as shown by arrows. The resulting intrinsic gold layers 134, 140 and indium layer 142 are thinner than the initial intrinsic gold layers 134, 140 and indium layer 142.

Figure 7B:
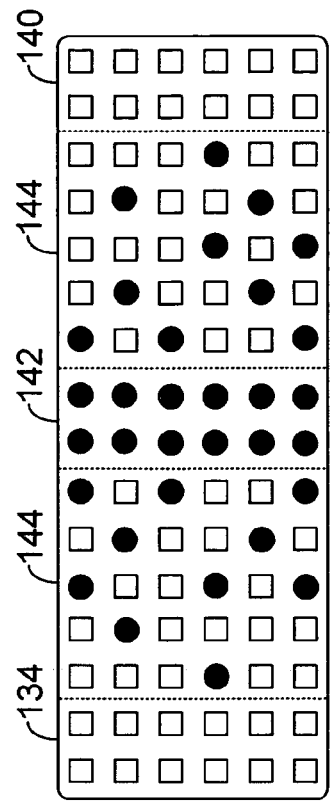
FIG. 7B conceptually illustrates individual atoms of FIG. 6B.
Figure 7A:
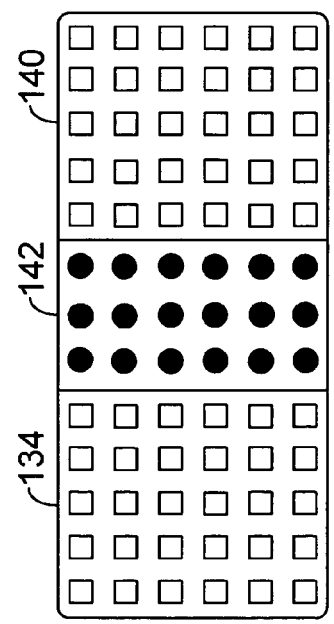
FIG. 7A conceptually illustrates individual atoms of FIG. 6A.

FIG. 7A conceptually illustrates individual atoms of FIG. 6A. Within FIG. 7A, open squares represent gold atoms and solid black circles represent indium atoms. Initially, upon being placed adjacent one another, the gold layers 134, 140 and indium layer 142 are separate from one another and likewise the gold and indium atoms are separate as well. No mixture of atoms may be present at interfaces between the gold layers 134, 140 and indium layer 142. The gold and indium atoms are illustrated arranged in a lattice structure. For example, the indium atoms may be arranged in a tetragonal lattice structure and the gold atoms may be arranged in a Cubic Close-Packed (CCP) lattice structure.

FIG. 7B illustrates diffusion of the individual atoms of FIG. 7A according to the process illustrated in FIG. 6B. Several indium and gold atoms diffuse throughout the gold layers 134, 140 and indium layer 142. Atoms of the gold layers 134, 140 may diffuse into the indium layer 142 and occupy interstitial lattice site positions of the indium layer 142, or gold atoms may occupy vacant lattice site positions of the indium layer 142. Vacant lattice site positions arise from the indium atoms diffusing into the gold layers 134, 140. Likewise, indium atoms may diffuse into the gold layers 134, 140 and occupy interstitial lattice site positions or vacant lattice site positions.

The diffusion begins by applying a specified pressure and temperature to the gold layers 134, 140 and indium layer 142. The alloy material 144 will begin to form between each gold layer 134, 140 and the indium layer 142. The alloy material 144 couples the upper mating surface 130 to the lower mating surface 136. The alloy material 144 bond strength depends upon the amount of diffusion of the indium layer 142 into each of the gold layers 134, 140. A complete diffusion of the indium layer 142 would result in a strong alloy material 144 bond.

Figure 8A:
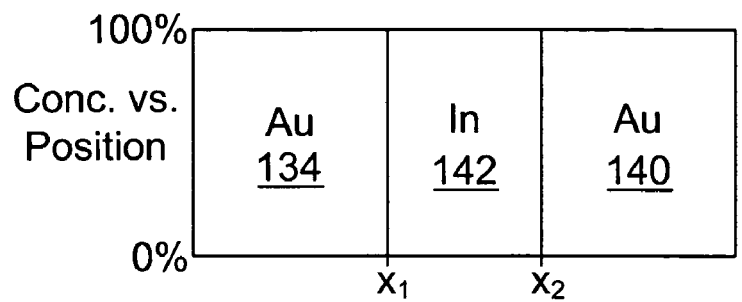
FIGS. 8A–8B illustrate amounts of concentrations present according to FIGS. 7A–7B.
Figure 8B:
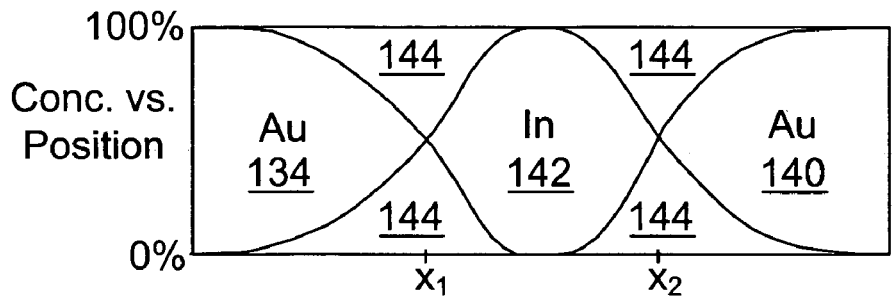

FIGS. 8A–8B illustrate amounts of concentrations of materials present according to FIGS. 7A–7B. FIG. 8A illustrates an initial concentration versus position diagram according to FIG. 7A. The concentrations are shown according to the amount of intrinsic material, and the positions are shown according to width of the materials. Initially, the gold layers 134, 140 and indium layer 142 comprise 100% of their intrinsic composition. The interface between each layer comprises an abrupt difference in concentrations of material.

FIG. 8B illustrates an intermediate concentration versus position diagram according to FIG. 7B. While performing the process illustrated in FIG. 5B, the intermediate concentrations of the gold layers 134, 140, the indium layer 142, and the alloy material 144 are as shown in FIG. 8B. The interface between each layer comprises a gradual transition of concentration from gold to indium. Centers of each interface between the gold layers 134, 140 and indium layer 142 are illustrated at points $x_1$ and $x_2$. The center of each interface comprise the alloy material 144 as illustrated in FIG. 8B.

Figure 8C:
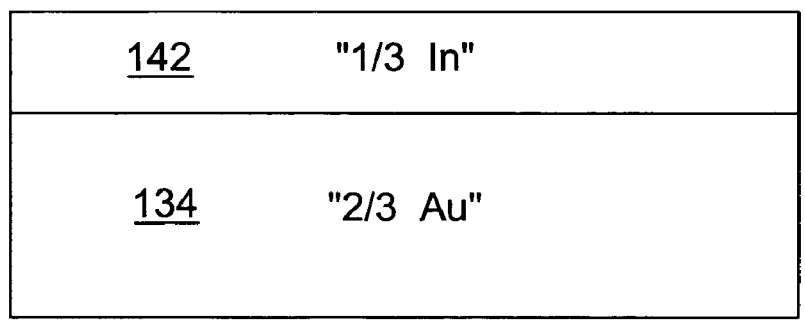
FIG. 8C illustrates a bond formed in accordance with one embodiment of the present invention.

FIG. 8C illustrates a conceptual final concentration of a bond formed in one embodiment of the present invention. In a homogeneous alloy bond 146, the center of the bond comprises approximately 66% concentration of gold and approximately 33% concentration of indium resulting in a homogeneous alloy material 144 as illustrated in the diagram of FIG. 8C. This is consistent with a 2:1 ratio of gold to indium in accordance with embodiments of the present invention.

In one embodiment, the upper bonding material 132 includes properties that exhibit better bonding characteristics to the materials it is adjacent to, than the adjacent materials would have to each other. For instance, in the example discussed above, gold does not bond well to substances such as dielectrics, however chromium bonds well to dielectrics. Therefore, a layer of chromium is deposited onto the surface of the dielectric, and subsequently, the layers of gold and indium may be deposited upon the layer of chromium. The layer of chromium is necessary in this instance to achieve an acceptable adhesion contact.

The upper bonding material 132 and the lower bonding material 138 may be chosen to have higher melting temperatures than the upper and lower diffusion materials 134, 140 and the interdiffusion material 142. For example, in a preferred embodiment, chromium is chosen as the upper and lower bonding materials 132, 138. Chromium has a melting temperature of 1907° C., much larger than the melting temperatures of other preferred materials for use in accordance with embodiments of the present invention, such as gold 1064° C., lead 327° C., tin 450° C., and indium 156° C. Therefore, the bonding process in various embodiments of the present invention will not interfere with the bond between the chromium layer and its mating surfaces.

The pressure, heat, time of each applied, and other variables depend on the materials used in the layers of the bonds and the thickness of each because the diffusion rates for each material are different. Therefore, bond formation depends upon bonding temperature, mutual diffusivities, and diffusion rates of the diffusing materials. Within the alloy material 144, nucleations and associated voids can form due to unequal diffusivities, dissimilar diffusion paths, and improper pressure, heat, and the extent of applying each to the bonding materials. Nucleations and voids are not preferred because they can damage and weaken a bond. The associated variables used in the bonding process should therefore be chosen to provide a homogenous bond.

Accordingly, the pressure, heat and time applied may be calculated to achieve an ample amount of diffusion to obtain an acceptable bond strength. Due to various molecular sizes, various molecular shapes, and various binding of molecules, bond strengths and bond homogeneity for materials are unequal. Diffusing rates, diffusivities and associated diffusion coefficients are obtained as a product of thermodynamic and kinetic factors and can be established from experimental studies and results as in the CRC Handbook mentioned earlier.

In one embodiment, a Solid to Liquid InterDiffusion (SLID) process is used to couple the upper mating surface 130 to the lower mating surface 136. For a more complete understanding of SLID bonding techniques, reference is made to: "Applications of Solid Liquid Inter Diffusion (SLID) bonding integrated-circuit applications", by L. Bernstein et al., Transaction of the Metallurgical Society, vol. 236, March 1966, pp. 405–412. Furthermore, U.S. Pat. No. 5,106,009 to Humpston et al. is hereby incorporated by reference as describing several possible SLID alloys and the suggested processing conditions for those alloys. The SLID process is a solid state bonding operation where the bonding temperatures do not exceed the melting points of the materials to be joined, and therefore, the formation of a bond is based on a chemical diffusion of atoms of materials across their adjacent interfaces. The SLID process is a low temperature process that yields a high temperature and high strength bond.

The bonding method may also affect the operating range of the micro-machine 110 and MEMS, depending on the conditions under which the selected bonding materials degrade. As a result, melting temperatures of materials may limit possible applications of MEMS. For example, using the preferred materials, the limiting melting temperature of the bond formed will be due to the indium material, although using the SLID process the melting temperature of the bond will be higher than that of indium. For instance, the melting temperature of indium is 156° C., however, when formed with gold, the resulting alloy material 144 melting temperature is between 232°–450° C. Accordingly, as an example, the highest operating temperature for a MEMS including an $AuIn_2$ bond may be near 450° C.

The bonding process disclosed in accordance with embodiments of the present invention allows a bond to be formed with a higher melting temperature than the element contained within the bond with the lowest intrinsic melting temperature. The materials used within the bond should be chosen according to an intended application of the MEMS. In addition, the chemical compatibility of materials should be taken into account when choosing materials for use in the bonds. Moreover, the bonding process should not interfere with previously completed processing steps nor limit subsequent processing steps.

F. Bonding and Packaging Processes Used in Accordance with Applications of MEMS Based Products In one embodiment, an application of a MEMS device is miniaturizing sensors and electronics. For example, a ten cubic inch system may be modified into a two cubic inch system by use of wafer scale integration in accordance with a MEMS device. In one embodiment, wafer scale integration is a process that slices large crystals of pure silicon into thin wafers of silicon. On a single silicon wafer, different micro-circuits are fabricated for different electronic components. These micro-circuits can be coupled together electronically on the silicon wafer. This may lower space and power requirements of the entire system compared to conventional techniques.

Wafer scale integration allows for large micro-electronic systems to be produced on a single wafer of silicon. The bonding process disclosed in accordance with embodiments of the present invention provides a method to couple mechanical components to the wafers, therefore, allowing for a Micro-Electro-Mechanical System (MEMS) to be fabricated. For example, a micro-circuit may be etched onto a silicon wafer. A component of a pressure actuated sensor can then be coupled to the micro-circuit using the SLID bonding process disclosed in accordance with one embodiment of the present invention, to provide an inertial sensor in the form of a MEMS device.

In one embodiment, the chip 100 is a MEMS in the form of an inertial sensor. The sensor may be exposed to severe conditions, such as large gravitational forces therefore, a strong effective bond is necessary for members of the MEMS. It may be preferred to provide an electrically conductive bond as well. It is believed that these obstacles may be overcome using the SLID bonding process described. As mentioned, preferred materials for use in a SLID bond within a MEMS are gold, tin, indium, and lead. A gold-indium SLID bond may result in a more effective bond than a conventional tin-lead solder. The gold-indium SLID bond may be fabricated with less effort than a gold-tin SLID bond due to the conditions according to temperatures and pressures needed to fabricate each. However, tin may be preferred in more instances than indium for high quality vacuum systems because indium may be more troublesome to control.

Figure 9:
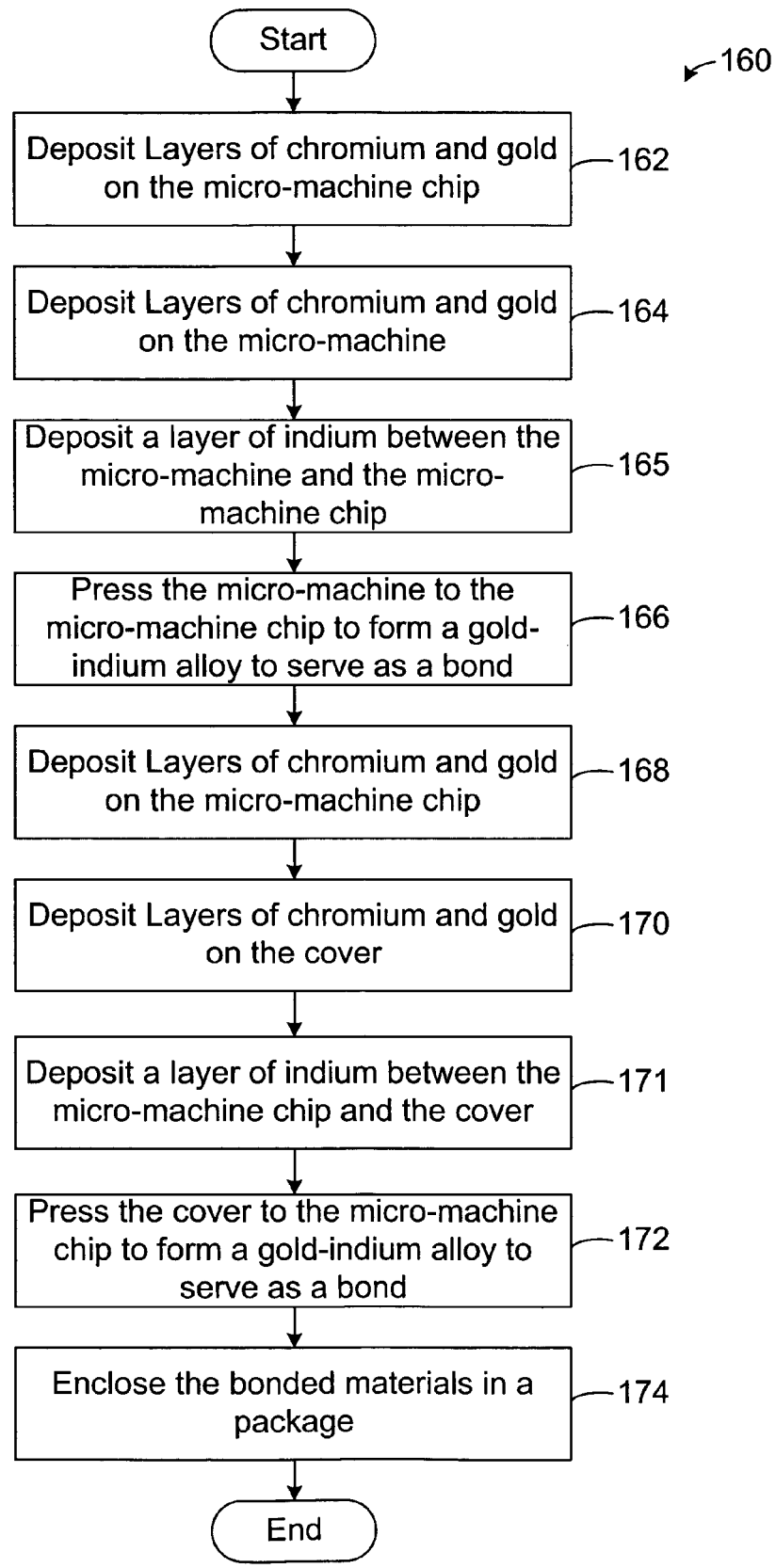
FIG. 9 is a flowchart depicting functional steps employed in one embodiment of the present invention.

FIG. 9 is a flowchart depicting a bonding process 160 employed in one embodiment of the present invention. In one embodiment, the bonding process 160 illustrates steps of manufacturing a MEMS or a MEMS based device, such as the chip 100 illustrated in FIG. 1A. The bonding process 160 begins by depositing layers of chromium and gold onto a surface of the micro-machine chip 108 as shown at block 162. The layer of chromium is deposited first, followed by the layer of gold. Next layers of chromium and gold are deposited on a surface of the micro-machine 110 as shown at block 164. As before, the layer of chromium is deposited first, followed by the layer of gold. Next, a layer of indium is deposited between the micro-machine chip 108 and the micro-machine 110 as shown at block 165. The layer of indium may be deposited onto the layer of gold on the micro-machine 110 or onto the layer of gold on the micro-machine chip 108. A bond is formed between the micro-machine 110 and the micro-machine chip 108 by pressing the layers of chromium and gold on the micro-machine chip 108 to the layers of chromium and gold on the micro-machine 110 with the layer of indium in between in order to form a gold-indium alloy to serve as the bond as shown within block 166. While pressing the micro-machine chip 108 to the micro-machine 110, both the micro-machine chip 108 and the micro-machine 110 may be heat in order to stimulate a thermal diffusion of the layers of materials.

Subsequently, the cover 114 is coupled to the micro-machine chip 108 using the following process. Layers of chromium and gold are deposited onto a surface of the micro-machine chip 108 as shown at block 168. Next, layers of chromium and gold are deposited on a surface of the cover 114 as shown at block 170. As before while bonding the micro-machine chip 108 to the micro-machine 110, the layers of chromium are deposited first, followed by the layers of gold. Next, a layer of indium is deposited between the micro-machine chip 108 and the cover 114 as shown at block 171. The indium may be deposited onto either the gold layer on the micro-machine chip 108 or onto the gold layer on the cover 114. A bond is formed between the cover 114 and the micro-machine chip 108 by pressing the layers of chromium and gold on the micro-machine chip 108 to the layers of chromium and gold on the cover 114 with the layer of indium in between to form a gold-indium alloy to serve as the bond as shown at block 172.

Subsequently, the bonded materials are enclosed in a package as shown at block 174, such as the plastic package 102 illustrated within FIG. 1A, a Small Outline Integrated Circuit (SOIC) package, a Plastic Leaded Chip Carrier (PLCC) package or a Quad Flat Package (QFP) that can all be adapted to meet a height requirement of the micro-machine 110 with a silicon cover 114 (e.g., usually 3 mm or above). The process of depositing chromium onto the micro-machine chip 108, the micro-machine 110, and the cover 114 may be omitted in some embodiments, especially if these members comprise a metal or ceramic material. In addition, alternate materials other than chromium, gold, and indium may be used in the bonding process 160 of the flowchart of FIG. 9.

Another packaging option other than the plastic package 102 that may be used in accordance with block 174 is a matrix format package, comprised of a ceramic or a laminate substrate. A cavity can be formed by placing an epoxy or adhesive dam around the bonded materials with the ceramic or laminate substrate mounted on top of the epoxy dam. The dam is applied after leads, such as leads 118a–f, are bonded to the micro-machine chip 108. The package can be lidded with a plastic, an aluminum or a ceramic material. The lid material can be positioned over the epoxy or adhesive dam.

Still another packaging option that may be used in accordance with block 174 is a liquid encapsulant package. The liquid encapsulant packaging option may be used for fragile micro-machines because the liquid encapsulant packaging may be able to more sufficiently protect the micro-machine 110 and the bonded materials than the plastic package 102 or the epoxy dam. A casing may be bonded to the surface of the micro-machine 110 and filled with liquid to create the liquid encapsulant. U.S. Pat. No. 5,399,805 to Tyler et al. is hereby incorporated by reference as describing a possible liquid electronic packaging encapsulant. The bonding process 160 disclosed in accordance with embodiments of the present invention may be used with the packaging techniques described within Tyler et al.

The deposition of layers of materials used in accordance with embodiments of the present invention and described within the flowchart of FIG. 9 may be done using vacuum deposition. Such vacuum deposition methods as an electron beam vacuum deposition process, a sputtering process, a Chemical Vapor Deposition (CVD) process, a Metal Organic Chemical Vapor Deposition (MOCVD) process, an ion beam process or the like, are all possible processes for forming layers of materials. The process used should produce substantially homogeneous layers free of defects to produce an effective bond. Each method of applying the materials to the mating surfaces alters the physical condition of the mating surfaces differently. For example, an electroplating process may introduce pours into the surfaces of the gold and indium materials. Alternatively, a vacuum deposition process may produce more dense materials on the surfaces of mating surfaces. Correspondingly, the process of deposition of layers of materials should be chosen according to a desired application of the MEMS.

One of skill in the art will appreciate that the bonding and packaging processes discussed in accordance with embodiments of the present invention are believed to be capable of handling a mass production of MEMS. The bonding process 160 illustrated in the flowchart of FIG. 9 may be used in practically all bonds necessary within a MEMS. Applying SLID bonding to MEMS and MEMS based devices allows manufacturing and designing to be completed in a timely fashion and at a low cost.

Exemplary embodiments of the present invention have been illustrated and described. It will be understood, however, that changes and modifications may be made to the present invention without deviating from the scope or extent of the present invention, as defined by the following claims. It should be understood that the processes, methods and devices described herein are not affiliated, related or limited to any particular type of system unless indicated otherwise.

In view of the wide variety of embodiments to which the principles of the present invention can be applied, it should be understood that the illustrated embodiments are exemplary only, and should not be taken as limiting the scope or extent of the present invention. For example, while gold, tin, chromium, lead, and indium have been described as preferred materials for use with the present invention, other materials and alloys may be used as well if bonding process characteristics are chosen which are suitable for the selected bonding materials. Additionally, more components or members of MEMS may be present other than those illustrated within the chip 100 of FIG. 1A. For example, additional protective covers, non-conductive materials, and adhesive substances may be used in accordance with the chip 100 of FIG. 1A. Moreover, the steps of the flowchart diagram in FIG. 9 may be taken in sequences or steps other than those described, and more or fewer steps may be used in conjunction with bonding process 160.

The claims should not be read as limited to the described order or elements unless stated to that effect. Therefore, all embodiments that come within the scope and spirit of the following claims and equivalents thereto are claimed as the invention.

We claim:

1. A Micro-Electro-Mechanical System (MEMS) comprising in combination:
   a substrate comprising a base;
   a micro-machine coupled to the substrate; and
   a cover coupled to the substrate, the cover mounted over the micro-machine,
   wherein the cover and the micro-machine are coupled to the substrate by forming at least one bond between the cover and the substrate and between the micro-machine and the substrate, wherein the cover, the micro-machine, and the substrate each have mating surfaces at which the at least one bond is formed, and wherein the at least one bond is formed by:
   depositing a first layer of mating material on a first mating surface;
   depositing a first layer of bonding material on the first layer of mating material, wherein the first layer of bonding material is selected from the group consisting of gold and tin;
   depositing a second layer of mating material on a second mating surface;
   depositing a second layer of bonding material on the second layer of mating material, wherein the second layer of bonding material is selected from the group consisting of indium and lead; and pressing the first layer of bonding material to the second layer of bonding material, thereby forming an alloy to serve as the at least one bond between the mating surfaces of the cover and the substrate and between the mating surfaces of the micro-machine and the substrate.

2. The MEMS of claim 1, wherein the alloy serving as the at least one bond is selected from the group consisting of a gold-indium alloy, a gold-lead alloy, a tin-indium alloy, and a tin-lead alloy.

3. The MEMS of claim 1, wherein the at least one bond is formed by a Solid-Liquid InterDiffusion (SLID) bonding process.

4. The MEMS of claim 1, wherein the at least one bond is formed by pressing the first layer of bonding material to the second layer of bonding material at a temperature between about 20° C. to about 200° C.

5. The MIEMS of claim 1, wherein the at least one bond is formed by pressing the first layer of bonding material to the second layer of bonding material at a pressure of about 2 pounds per square inch.

6. The MEMS of claim 1, wherein the at least one bond is formed by pressing the first layer of bonding material to the second layer of bonding material for about 6 hours.

7. The MEMS of claim 1, wherein the first layer of bonding material has a thickness between about 100 Angstroms to about 0.25 inches.

8. The MEMS of claim 1, wherein the second layer of bonding material has a thickness between about 50 Angstroms to about 0.125 inches.

9. The MEMS of claim 1, wherein the at least one bond is formed by pressing the first layer of bonding material to the second layer of bonding material at a pressure of about 2 pounds per square inch and at a temperature of about 100° C.

10. The MEMS of claim 1, wherein the at least one bond is formed by pressing the first layer of bonding material to the second layer of bonding material for about 6 hours at a pressure of about 2 pounds per square inch.

11. The MEMS of claim 1, wherein the at least one bond is formed by pressing the first layer of bonding material to the second layer of bonding material for about 6 hours at a temperature of about 100° C.

12. The MEMS of claim 1, wherein the first layer of mating material and the second layer of mating material are comprised of layers of chromium each having a thickness between about 5 Angstroms to about 100 Angstroms.

13. The MEMS of claim 1 further comprising a plurality of components movably coupled to the micro-machine, the plurality of components operable to perform mechanical operations.

14. The MEMS of claim 13, wherein the cover includes a cavity to provide open space to allow the plurality of components to move freely.

15. The MEMS of claim 1, wherein the at least one bond is formed by pressing the first layer of bonding material to the second layer of bonding material using an effective amount of pressure and temperature, for an effective amount of time to form the alloy to serve as the at least one bond between the mating surfaces of the cover and the substrate and between the mating surfaces of the micro-machine and the substrate.

16. The MEMS of claim 1, wherein the MEMS is a ring-laser gyroscope.

17. A Micro-Electro-Mechanical System (MEMS) comprising:
a substrate having a mating surface; and
a micro-machine having a mating surface and being coupled to the substrate by forming a bond between the micro-machine and the substrate, wherein the bond is formed by:
depositing a first layer of mating material on the mating surface of the substrate;
depositing a first layer of bonding material on the first layer of mating material, wherein the first layer of bonding material is selected from the group consisting of gold and tin;
depositing a second layer of mating material on the mating surface of the micro-machine; and
depositing a second layer of bonding material on the second layer of mating material, wherein the second layer of bonding material is selected from the group consisting of indium and lead; and
pressing the micro-machine to the substrate, thereby forming an alloy to serve as the bond between the mating surfaces of the substrate and the micro-machine.

18. The MEMS of claim 17, further comprising a cover coupled to the substrate, the cover being mounted over the micro-machine.

19. The MEMS of claim 17, wherein the MEMS is a ring-laser gyroscope.

* * * * *